United States Patent
Shie

(10) Patent No.: US 8,300,198 B2
(45) Date of Patent: Oct. 30, 2012

(54) LIQUID CRYSTAL PANEL

(75) Inventor: De-Ching Shie, Miao-Li (TW)

(73) Assignee: Chimei Innolux Corporation, Miaoli County (TW)

( * ) Notice: Subject to any disclaimer, the term of this patent is extended or adjusted under 35 U.S.C. 154(b) by 458 days.

(21) Appl. No.: 12/387,982

(22) Filed: May 11, 2009

(65) Prior Publication Data

US 2009/0279038 A1 Nov. 12, 2009

(30) Foreign Application Priority Data

May 9, 2008 (CN) .......................... 2008 1 0067122

(51) Int. Cl.
*G02F 1/133* (2006.01)

(52) U.S. Cl. ...................................... 349/150

(58) Field of Classification Search .................. None
See application file for complete search history.

(56) References Cited

U.S. PATENT DOCUMENTS

| | | | |
|---|---|---|---|
| 5,949,512 A * | 9/1999 | Taguchi ................... | 349/150 |
| 6,734,941 B2 * | 5/2004 | Yamazaki et al. ........... | 349/150 |
| 6,882,396 B2 | 4/2005 | Ko et al. | |
| 2006/0238450 A1 * | 10/2006 | Onodera .................. | 345/60 |
| 2007/0013856 A1 * | 1/2007 | Watanabe et al. ........... | 349/150 |
| 2008/0024714 A1 | 1/2008 | Park | |
| 2008/0100763 A1 | 5/2008 | Park | |
| 2008/0253101 A1 * | 10/2008 | Takenaka et al. ........... | 361/803 |
| 2009/0225268 A1 * | 9/2009 | Yokota ..................... | 349/143 |
| 2011/0182046 A1 * | 7/2011 | Shiota .................... | 361/760 |

FOREIGN PATENT DOCUMENTS

| | | |
|---|---|---|
| CN | 1551713 A | 12/2004 |
| CN | 1304887 C | 3/2007 |
| CN | 1959485 A | 5/2007 |
| CN | 101118327 A | 2/2008 |
| CN | 101175368 A | 5/2008 |
| JP | 2001-100233 A * | 4/2001 |

* cited by examiner

*Primary Examiner* — Mike Stahl
(74) *Attorney, Agent, or Firm* — Bacon & Thomas, PLLC

(57) ABSTRACT

A liquid crystal panel includes a signal transmission section and a flexible printed circuit (FPC). The signal transmission section includes electrical conductive terminals. The FPC includes an insulating film and conductive lines disposed on a first surface of the insulating film. The conductive lines are electrically connected to the electrical conductive terminals. The insulating film substantially covers the electrical conductive terminals.

20 Claims, 3 Drawing Sheets

LIQUID CRYSTAL PANEL

BACKGROUND

1. Technical Field

The present disclosure relates to liquid crystal panels, and more particularly to a liquid crystal panel with electrostatic discharge (ESD) protection.

2. Description of Related Art

Liquid crystal displays (LCDs) are commonly used as display devices for compact electronic apparatuses, because they provide good quality images and are also very thin. Liquid crystal panels of the LCDs, however, can suffer severe damage from electrostatic discharge (ESD), which intrudes into gate lines and data lines of the panel and can even render the display unusable.

What is needed, therefore, is a liquid crystal panel that can overcome the described limitations.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the present liquid crystal panel. In the drawings, like reference numerals designate corresponding parts throughout various views, and all the views are schematic.

DETAILED DESCRIPTION

Reference will now be made to the drawings to describe the present disclosure in detail.

Figure 1:
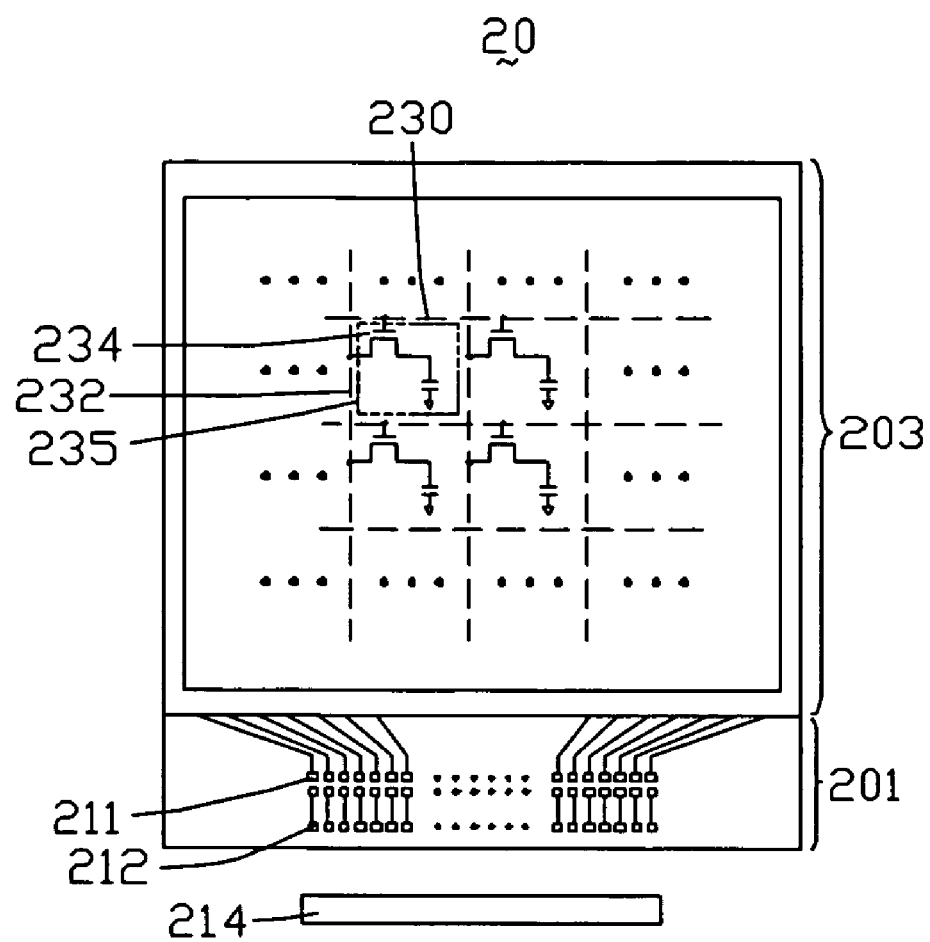
FIG. 1 is a top plan view of a first embodiment of a liquid crystal panel according to the present disclosure, the liquid crystal panel including a flexible printed circuit (FPC).
Figure 1:
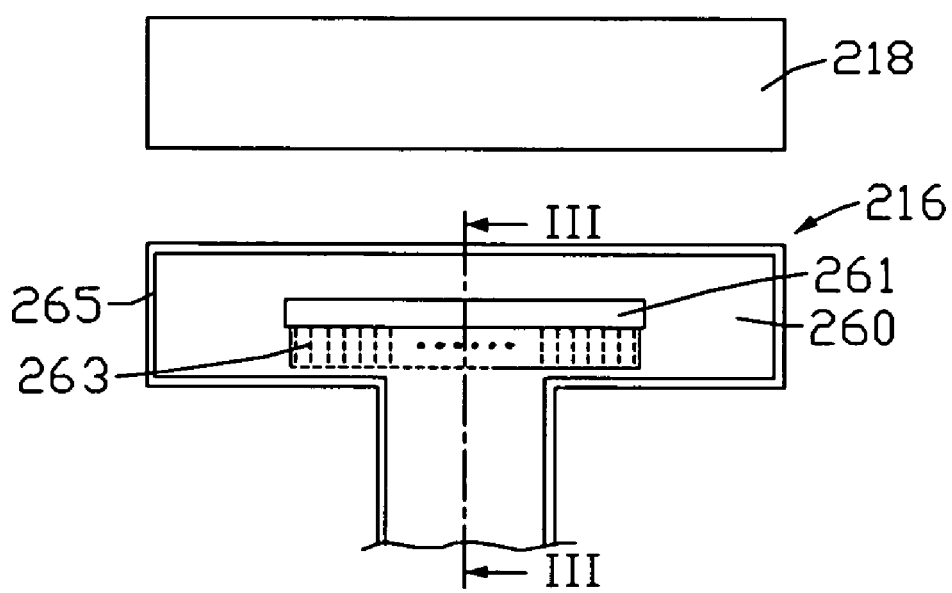
Figure 2:
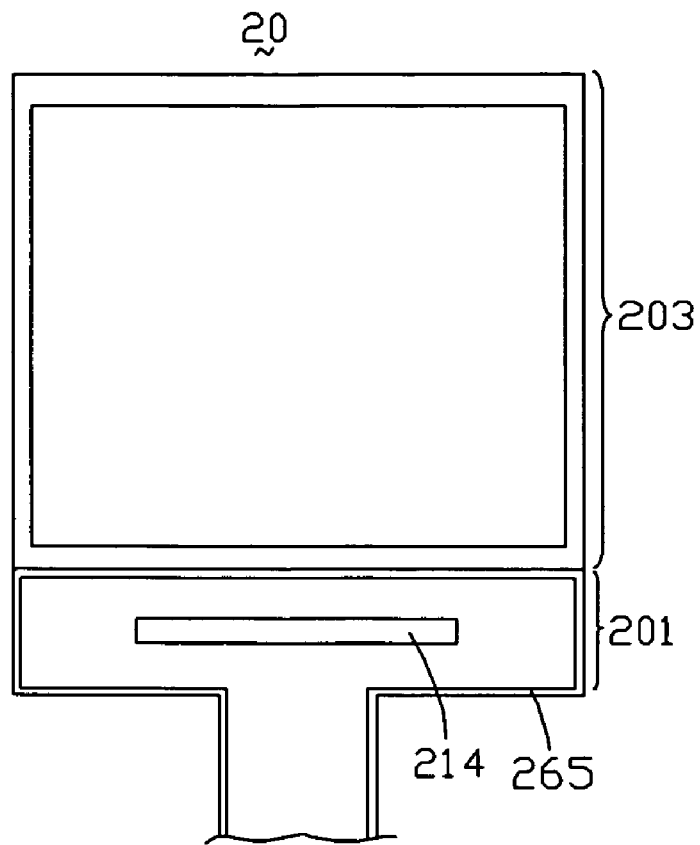
FIG. 2 is a top plan view of the assembled liquid crystal panel of FIG. 1.

Referring to FIG. 1 and FIG. 2, a first embodiment of a liquid crystal panel 20 according to the present disclosure includes a signal transmission section 201, a display section 203 adjacent to the signal transmission section 201, an integrated driving circuit 214, a flexible printed circuit (FPC 216), and an anisotropic conductive film (ACF) 218. In one embodiment, the ACF 218 is a resin film and includes a plurality of electrical particles. The ACF 218 has thermosetting and plastic characteristics. The shape of the ACF 218 corresponds to that of the signal transmission section 201. The integrated driving circuit 214 and the FPC 216 are fixed to the signal transmission section 201 via the ACF 218.

The display section 203 includes a plurality of gate lines 230, a plurality of data lines 232 and a plurality of thin film transistors (TFTs) 234. The gate lines 230 are parallel and extend along a longitudinal axis. The data lines 232 are parallel and are perpendicular to the gate lines 230. Thus, the crossing gate lines 230 and the data lines 232, cooperatively, define a plurality of pixel areas 235. Each of the TFTs 234 is disposed in one corresponding pixel area 235. The gate lines 230 provide gate voltages to the gates of the TFTs 234 to switch the TFTs 234 on or off. The data lines 232 provide source voltages to the pixel areas 235 via corresponding TFTs 234 respectively, for displaying images.

The signal transmission section 201 includes a plurality of extension terminals 211 and a plurality of connection terminals 212. The extension terminals 211 extend from the gate lines 230 and the data lines 232, respectively. Each of the connection terminals 212 includes two opposite connection points (not labeled). Each of the opposite connection points corresponds to one of the extension terminals 211.

The integrated driving circuit 214 includes a plurality of input pins (not shown) and a plurality of output pins (not shown). During assembly, the integrated driving circuit 214 is mounted on the signal transmission section 201. The input pins are disposed on the connection terminals 212 with the ACF 218 therebetween and the output pins are disposed on the extension terminals 211 with the ACF 218 therebetween. Pressure applied to the integrated driving circuit 214 crushes the particles, such that each input pin is electrically connected to the connection terminals 212 via the crushed particles of ACF 218, and each of the output pins is electrically connected to the extension terminal 211 correspondingly via the particles of the ACF 218.

Figure 3:
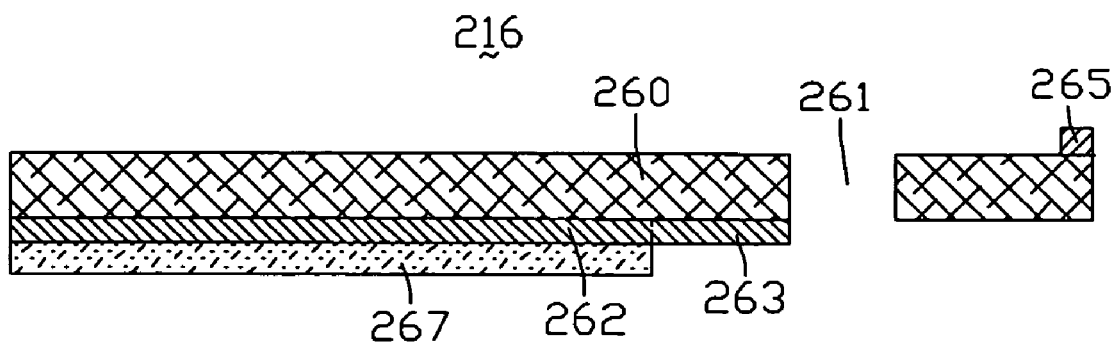
FIG. 3 is an enlarged cross-section of the FPC of the liquid crystal panel taken along line III-III of FIG. 1.

FIG. 3 is an enlarged cross-section of the FPC 216 of the liquid crystal panel 20 taken along line III-III of FIG. 1. The FPC 216 includes an insulating film 260, a plurality of conductive lines 262, a plurality of pads 263, a ground wire 265, and a protection film 267. In one embodiment, the insulating film 260 may be polyethylene terephthalate (PET) or polyimide (PI), for example. The insulating film 260 includes an opening 261 corresponding to the integrated driving circuit 214.

The conductive lines 262 and the pads 263 are disposed on one surface of the insulating film 260 facing the signal transmission section 201. The terminals of the conductive lines 262 form the pads 263. The pads 263 are disposed adjacent to the opening 261 and correspond to the connection terminals 212. The protection film 267 is made of an insulating material. The protection film 267 substantially covers the conductive lines 262. The protection film 267 and the insulating film 260 hold the conductive lines 262 therebetween so as to expose the pads 263. The ground wire 265 is disposed at the periphery of the other surface of the insulating film 260.

The FPC 216 substantially covers the signal transmission section 201. The integrated driving circuit 214 is disposed in the opening 261. The pads 263 are electrically connected to the connection terminals 212 via the ACF 218. Display signals are transmitted through the conductive lines 262 and the connection terminals 212 to the integrated driving circuit 214. The display signals are converted into driving voltages by the integrated driving circuit 214. The driving voltages are transmitted to the gate lines 230 and the data lines 232 so as to drive the display section 203 to display images.

The FPC 216 of the liquid crystal panel 20 covers the signal transmission section 201 such that, the insulating film 260 separates the extension terminals 211 and the connection terminals 212 from the surroundings, such that no static electricity can pass through the insulating film 260 to the extension terminals 211 and connection terminals 212. A path of static electricity from the extension terminals 211 to the connection terminals 212 is cut off. The static electricity is prevented from passing through the extension terminals 211 and connection terminals 212 into the integrated driving circuit 214, the gate lines 230, and the data lines 232 of the display section 203. Furthermore, the ground wire 265 is exposed to the surroundings, such that static electricity is released via the ground wire 265, so as to prevent static electricity from injuring the other components of the liquid crystal panel 20 or harming the users.

Figure 4:
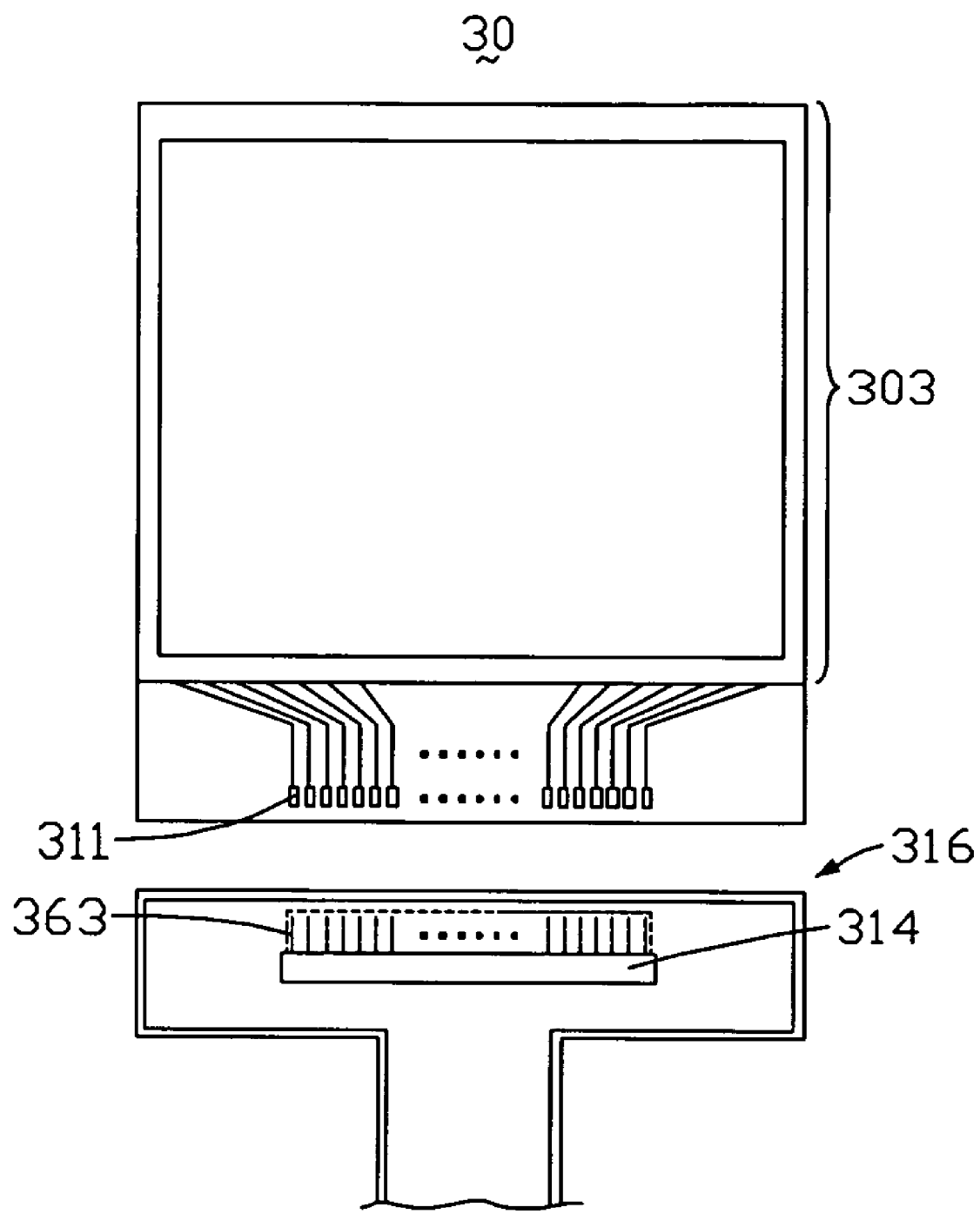
FIG. 4 is a top plan view of a second embodiment of a liquid crystal panel according to the present disclosure.

Referring to FIG. 4, a second embodiment of a liquid crystal panel 30 according to the present disclosure differs from the liquid crystal panel 20 of FIG. 1, in that a plurality of conductive lines (not shown) of a FPC 316 are cut off from a plurality of pads 363. An integrated driving circuit 314 is arranged on the FPC 316. Input pins (not shown) and output pins (not shown) of the integrated driving circuit 314 are electrically connected to the conductive lines and the pads 363 of the FPC 316, respectively. The pads 363 are electrically connected to extension terminals 311. Display signals are transmitted to the integrated driving circuit 316 by the conductive lines, and then through the pads 363 and the extension terminals 311 into gate lines (not shown) of a display section 303. The integrated driving circuit 314 of the liquid crystal panel 30 is arranged on the FPC 316, therefore, an assembly process of the liquid crystal panel is simplified, and a product yield is improved.

It is to be further understood that even though numerous characteristics and advantages of the present embodiments have been set forth in the foregoing description, together with details of the structures and functions of the embodiments, the disclosure is illustrative only; and that changes may be made in detail, especially in matters of shape, size, and arrangement of parts, within the principles of the embodiments, to the full extent indicated by the broad general meaning of the terms in which the appended claims are expressed.

What is claimed is:

1. A liquid crystal panel comprising:
a display section for displaying images;
a signal transmission section adjacent to the display section and for mounting an integrated driving circuit, wherein the integrated driving circuit is configured to convert display signals into driving voltages, the signal transmission section comprises a plurality of electrical conductive terminals, a first part of the electrical conductive terminals extends from the display section and electrically connects the integrated driving circuit with the display section for transmitting the driving voltages to the display section; and
a flexible printed circuit comprising an insulating film substantially covering the signal transmission section and a plurality of conductive lines disposed on a first surface of the insulating film and electrically connected to a second part of electrical conductive terminals for transmitting the display signals to the integrated circuit.

2. The liquid crystal panel of claim 1, wherein the flexible printed circuit further comprises a ground wire disposed on a second surface of the insulating film opposite to the signal transmission section.

3. The liquid crystal panel of claim 2, wherein the ground wire is disposed at a peripheral of the insulating film.

4. The liquid crystal panel of claim 1, wherein the insulating film defines an opening for accommodating the integrated driving circuit.

5. The liquid crystal panel of claim 1, wherein the flexible printed circuit further comprises an insulating protection film partially covering the conductive lines, the conductive lines are held between the protection film and the insulating film.

6. The liquid crystal panel of claim 5, wherein terminals of the conductive lines are exposed and form a plurality of pads.

7. The liquid crystal panel of claim 6, wherein the second part of the electrical conductive terminals comprises a plurality of connection terminals electrically connected to the pads, and the first part of the electrical conductive terminals comprises a plurality of extension terminals electrically connected to the display section, the connection terminals are separated from the extension terminals, the insulating film substantially covering the whole extension terminals and the whole connecting terminals.

8. The liquid crystal panel of claim 7, wherein the display section comprises a plurality of gate lines and a plurality of data lines, terminals of the gate lines and the data lines extending and forming the extension terminals, the integrated driving circuit comprising a plurality of input pins and a plurality of output pins electrically connected to the connection terminals and the extension terminals, respectively.

9. The liquid crystal panel of claim 1, wherein the flexible printed circuit is disposed at the signal transmission section via an anisotropic conductive film.

10. A liquid crystal panel comprising:
a display section for displaying images;
a signal transmission section adjacent to the display section for mounting an integrated driving circuit, wherein the integrated driving circuit is configured to converts display signals to driving voltages, the signal transmission section comprises a plurality of electrical conductive terminals, a first part of the electrical conductive terminals extends from the display section and electrically connects the integrated driving circuit with the display section for transmitting the driving voltages to the display section; and
a flexible printed circuit comprising an insulating film substantially covering the signal transmission section, a plurality of conductive lines disposed on a first surface of the insulating film, and a ground wire disposed at a periphery of the insulating film, the conductive lines are electrically connected to a second part of electrical conductive terminals for transmitting the display signals to the integrated driving circuit.

11. The liquid crystal panel of claim 10, wherein the ground wire is disposed on a second surface of the flexible printed circuit opposite to the signal transmission section.

12. The liquid crystal panel of claim 10, wherein the flexible printed circuit comprises an insulating protection film partially covering the conductive lines, the exposed part of the conductive lines form a plurality of pads, the second part of the electrical conductive terminals are electrically connected to the pads.

13. The liquid crystal panel of claim 12, wherein the integrated driving circuit comprises a plurality of input pins electrically connected to the conductive lines and a plurality of output pins electrically connected to the first part of the electrical conductive terminals, the insulating film defines an opening for accommodating the integrated driving circuit.

14. The liquid crystal panel of claim 10, wherein the flexible printed circuit is disposed on the signal transmission section via an anisotropic conductive film.

15. The liquid crystal panel of claim 12, wherein the electrical terminals comprises a plurality of connection terminals electrically connected to the pads and a plurality of extension terminals electrically connected to the display section, the connection terminals are separated from the extension terminals, the insulating film substantially covering the whole extension terminals and the whole connecting terminals.

16. The liquid crystal of claim 15, wherein the display section comprises a plurality of gate lines and a plurality of data lines, terminals of the gate lines and the data lines extending and forming the extension terminals, the integrated driving circuit comprising a plurality of input pins and a plurality of output pins electrically connected to the connection terminals and the extension terminals, respectively.

17. The liquid crystal panel of claim 10, wherein the insulating film is polyethylene terephthalate or polyimide.

18. A liquid crystal panel comprising:
a display section comprising a plurality of gate lines and a plurality of data lines;
an integrated driving circuit configured for receiving display signals and generating driving voltages based on the display signals,
a signal transmission section adjacent to the display section and comprising a plurality of terminals and a plurality wire lines connecting the plurality of terminals with the gate lines and the data lines, the plurality of terminals electrically connecting with the integrated driving circuit for transmitting the driving voltages to the gate lines and the data lines via the plurality wire lines; and
a flexible printed circuit electrically connecting with the integrated driving circuit for providing the display signals to the integrated driving circuit, the flexible printed circuit comprising an insulating film covering the plurality of terminals and the plurality wire lines on signal transmission section, and a plurality of conductive lines disposed on a first surface of the insulating film.

19. The liquid crystal panel of claim 18, wherein the signal transmission section further comprises another plurality of terminals connecting with the integrated driving circuit, terminals of the conductive lines are exposed and form a plurality of pads connecting with the another plurality of terminals, and the plurality of pads and the another plurality of terminals are covered by the insulating film.

20. The liquid crystal panel of claim 19, wherein the flexible printed circuit further comprises a ground wire disposed on a surface of the insulating film opposite to the signal transmission section.

* * * * *